(12) United States Patent
Pickering

(10) Patent No.: US 10,586,589 B2
(45) Date of Patent: Mar. 10, 2020

(54) MEMORY UNIT

(71) Applicant: SURECORE LIMITED, Leeds (GB)

(72) Inventor: Andrew Pickering, Rugby (GB)

(73) Assignee: SURECORE LIMITED, Leeds (GB)

( * ) Notice: Subject to any disclaimer, the term of this patent is extended or adjusted under 35 U.S.C. 154(b) by 0 days.

(21) Appl. No.: 15/309,423

(22) PCT Filed: Apr. 20, 2015

(86) PCT No.: PCT/GB2015/051178
§ 371 (c)(1),
(2) Date: Nov. 7, 2016

(87) PCT Pub. No.: WO2015/170074
PCT Pub. Date: Nov. 12, 2015

(65) Prior Publication Data
US 2017/0206949 A1    Jul. 20, 2017

(30) Foreign Application Priority Data

May 8, 2014   (GB) .................................. 1408128.5

(51) Int. Cl.
*G11C 7/12*        (2006.01)
*G11C 11/419*     (2006.01)
(52) U.S. Cl.
CPC .............. *G11C 11/419* (2013.01); *G11C 7/12* (2013.01); *G11C 2207/002* (2013.01); *G11C 2207/005* (2013.01); *G11C 2207/12* (2013.01)
(58) Field of Classification Search
CPC ............................. G11C 7/12; G11C 2207/12
(Continued)

(56) References Cited

U.S. PATENT DOCUMENTS 4,627,031 A * 12/1986 van Tran .............. G11C 7/1048
                                                                        365/190
4,658,381 A *  4/1987 Reed ........................ G11C 8/18
                                                                        365/203
(Continued)

FOREIGN PATENT DOCUMENTS

CN           1199229        11/1998
CN         101093716        12/2007
(Continued)

OTHER PUBLICATIONS

International Preliminary Report on Patentability, issued by the International Bureau of WIPO, Application No. PCT/GB2015/051178, dated Nov. 8, 2016, 6 pages.
(Continued)

*Primary Examiner* — Amir Zarabian
*Assistant Examiner* — Jay W. Radke
(74) *Attorney, Agent, or Firm* — Meunier Carlin & Curfman LLC

(57) ABSTRACT

There is provided a memory unit (100). The memory unit comprises a plurality of memory cells (110), each memory cell of the plurality of memory cells being operatively connected to data input and output circuitry by a pair of bit lines (130*a*, 130*b*), a pre-charge circuit (150) configured to provide a voltage for charging the bit lines, and a multiplexer circuit. The multiplayer circuit (140) comprises, for each bit line, an associated NMOS (142*a*, 142*b*) device that is configured to selectively connect the bit line (130*a*, 130*b*) to the data input and output circuitry and to the pre-charge circuit (150) when activated by a corresponding bit line selection signal, and a multiplex controller (144) that is configured to be able to select each pair of bit lines by activating the associated NMOS devices (142*a*, 142*b*) using the corresponding bit lines selection signals.

19 Claims, 9 Drawing Sheets

(58) Field of Classification Search
USPC ........................................................ 365/203
See application file for complete search history.

(56) References Cited

U.S. PATENT DOCUMENTS

| | | | | |
|---|---|---|---|---|
| 4,813,022 A * | 3/1989 | Matsui | ................. | G11C 11/419 327/55 |
| 4,856,106 A | 8/1989 | Teraoka | | |
| 4,996,671 A * | 2/1991 | Suzuki | ................. | G11C 7/1048 365/203 |
| 5,268,874 A * | 12/1993 | Yamauchi | ............. | G11C 11/419 365/189.06 |
| 5,349,560 A * | 9/1994 | Suh | .......................... | G11C 7/12 365/190 |
| 5,600,601 A * | 2/1997 | Murakami | ............... | G11C 7/12 365/203 |
| 5,642,324 A * | 6/1997 | Ghosh | ...................... | G11C 7/22 365/189.07 |
| 5,771,190 A * | 6/1998 | Okamura | ............. | G11C 11/412 365/154 |
| 5,917,745 A * | 6/1999 | Fujii | ......................... | G11C 7/18 365/149 |
| 7,599,237 B2 * | 10/2009 | Jung | ......................... | G11C 7/12 365/203 |
| 9,336,865 B1 * | 5/2016 | Chu | ...................... | G11C 11/419 |
| 2002/0003743 A1 * | 1/2002 | Kunikiyo | ................. | G11C 8/16 365/230.05 |
| 2002/0075729 A1 * | 6/2002 | Choi | ........................ | G11C 7/12 365/189.11 |
| 2003/0021168 A1 * | 1/2003 | Ishida | ................... | G11C 11/419 365/200 |
| 2003/0090951 A1 | 5/2003 | Yokozeki | | |
| 2004/0037108 A1 * | 2/2004 | Notani | ................... | G11C 15/04 365/154 |
| 2006/0274587 A1 * | 12/2006 | Houston | ................. | G11C 7/12 365/203 |
| 2008/0062792 A1 * | 3/2008 | Jung | ........................ | G11C 7/12 365/203 |
| 2008/0130383 A1 * | 6/2008 | Kushida | ................ | G11C 11/413 365/191 |
| 2009/0146686 A1 * | 6/2009 | Voogel | ................ | G06F 15/7867 326/38 |
| 2009/0154274 A1 | 6/2009 | Abu-Rahma et al. | | |
| 2009/0168499 A1 | 7/2009 | Kushida et al. | | |
| 2009/0219767 A1 * | 9/2009 | Lines | ..................... | G11C 5/147 365/189.09 |
| 2010/0091581 A1 * | 4/2010 | Van Winkelhoff | ... | G11C 7/1048 365/189.05 |
| 2010/0103755 A1 * | 4/2010 | Chen | ........................ | G11C 7/12 365/203 |
| 2011/0158021 A1 * | 6/2011 | Wiatrowski | ............. | G11C 7/12 365/203 |
| 2011/0235448 A1 * | 9/2011 | Wu | .......................... | G11C 7/08 365/203 |
| 2011/0299349 A1 * | 12/2011 | Deng | ..................... | G11C 29/50 365/201 |
| 2012/0223876 A1 * | 9/2012 | Kitazawa | ............... | G09G 3/3258 345/84 |
| 2013/0051163 A1 | 2/2013 | Koike | | |
| 2013/0194877 A1 | 8/2013 | Yang et al. | | |
| 2015/0098267 A1 * | 4/2015 | Jain | ......................... | G11C 7/12 365/154 |

FOREIGN PATENT DOCUMENTS

| | | |
|---|---|---|
| EP | 0442610 A2 | 8/1991 |
| GB | 2512844 A | 10/2014 |
| JP | H01245487 A1 | 9/1989 |
| KR | 20030049003 A | 6/2003 |

OTHER PUBLICATIONS

Examination Report, issued by the United Kingdom Intellectual Property Office, in connection with United Kingdom Patent Application No. GB1408128.5, dated May 8, 2017, 3 pages.
Combined Search and Examination Report issued by the GB Intellectual Property Office, Application No. GB1408128.5, dated Nov. 6, 2014, 7 pages.
International Search Report and Written Opinion of the International Searching Authority, Application No. PCT/GB2015/051178, dated Jul. 20, 2015, 9 pages.
Office Action dated Apr. 28, 2018, issued in Chinese Application No. 201580022653.2, 34 pages (with English-language translation).
Second Office Action dated Mar. 28, 2019, issued in Chinese Application No. 201580022653.2, 11 pages (with English-language translation).
Office Action issued in Taiwanese Application No. 104112795, dated Dec. 10, 2018, 17 pages (with English-language translation).

* cited by examiner

Figure 5a
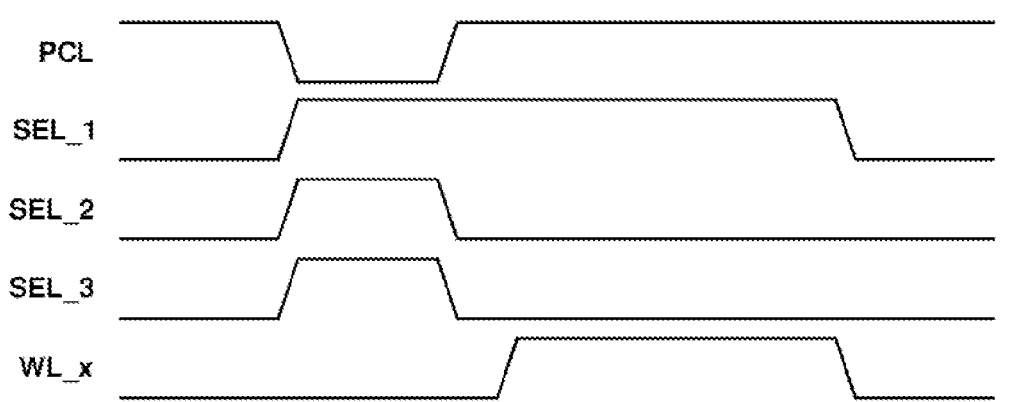
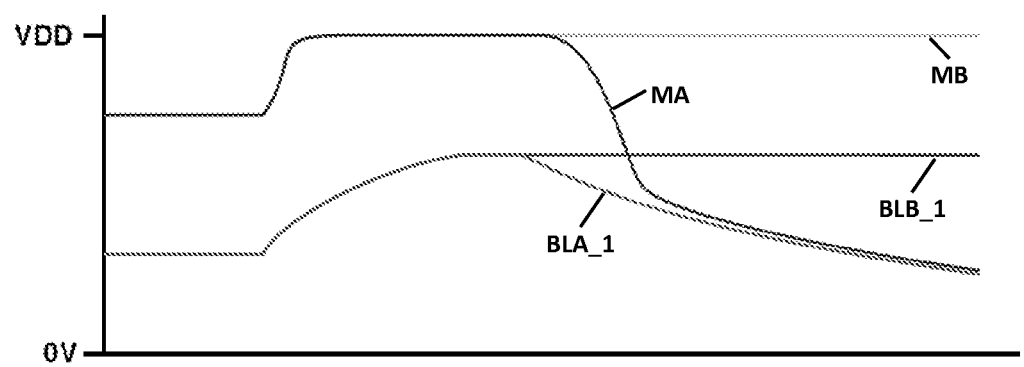
Figure 5b

MEMORY UNIT

The present invention relates to SRAM memory and relates particularly to such SRAM memory that has a reduced power requirement and improved stability.

Static random access memory (SRAM) provides the vital function of data storage in a huge number of electronic systems. As demand for greater capacity increases in tandem with a proliferation of battery powered devices, the need to reduce power consumption becomes ever more pressing.

The most commonly-used design of memory cell is the 6-transistor circuit shown in FIG. 1 and consists of a storage element 10 made up of two back-to-back inverters ([MN1, MP1] and [MN2, MP2]) 11a, 11b, 12a, 12b with access transistors (MA1 and MA2) 16a, 16b which are turned ON by means of a word line control (WL) to form a conducting path between the data storage nodes (N1 and N2) 13, 14 of the cell and the bit lines (BLA and BLB).

Writing to the cell is achieved by forcing a high voltage onto one of BLA or BLB whilst simultaneously forcing a low voltage onto the other, and then driving the word line (WL) high to activate the access path allowing the voltage levels held on the bit lines (BLA and BLB) to overcome the state of the storage element. The word line is then driven low to disconnect the memory cell with its data store held in its new state.

Reading from the cell is achieved by initially driving both bit lines to a notionally high voltage level before then driving the word line (WL) high. One of either BLA or BLB will then be pulled low through the access devices (MA1 and MA2) by the low voltage side of the storage element. The difference in voltage levels between the two bit lines can then be sensed and used to determine the data value.

One crucial part of the design of this cell is the drive strength ratios of the NMOS (n-channel MOSFET) pull down transistors (MN1 and MN2), the NMOS access devices (MA1 and MA2) and the PMOS (p-channel MOSFET) pull up devices (MP1 and MP2). In particular, the access devices need to be sufficiently large relative to the pull-up devices to guarantee that the state of the storage element is over-written during a write, but not so large (relative to the pull-down devices) that the cell becomes over-loaded and unstable during a read thereby causing the stored data value to be lost.

A block of memory constructed from traditional 6-transistor memory cells is shown in FIGS. 2 and 3. This block contains an array of M rows by N columns of cells 10, with the word lines connected horizontally across the array and bit lines running vertically. The orientation of the array is arbitrary (e.g. the array could equally be orientated such that word lines are connected vertically across the array with the bit lines running horizontally); however, by convention the word lines always are said to run along the rows of an array of memory cells whilst the bit lines are always said to run down the columns of an array of memory cells. At the bottom of the array there is a multiplexer (mux) structure selecting which of the columns is to be accessed (for either read or write) according to a set of column select signals (SEL_1, SEL_2 etc.) which are derived from the address supplied to the memory. Such a block would be replicated for each bit of the memory input/output data word.

Due to the relatively small size of a memory cell compared with the data input/output circuitry, it is usual to multiplex the bit lines from a number of columns (typically 4, 8 or 16) into a single input/output path. This arrangement means that when a memory cell within an array is being accessed (i.e. one of the word lines is turned on) there is actually a whole row of memory cells selected even though only a fraction are actually being targeted for a read or write operation. Therefore it is essential to ensure that the bit lines for all the columns are at a suitable initial voltage to ensure the memory cells along the selected row of the array aren't disrupted during the operation.

The most common choice for achieving this is to pre-charge the bit lines to the positive supply rail voltage (VDD), as a memory cell can withstand the bit lines being pulled high due to the pull-down (NMOS) devices being stronger than pull-up (PMOS) devices, but the memory cell then becomes vulnerable to disruption if the high internal data storage node is pulled low via the access devices (i.e. MA1 and MA2). In order to achieve this pre-charging of the bit lines, all the bit lines need to be somehow connected via a PMOS device (or devices) to the positive rail (VDD), as NMOS transistors can only pull up so high until their threshold voltage causes the conduction path to shut off. This is usually done either using a set of pre-charge PMOS devices connected to every bit line (as shown by the pre-charge circuit in FIG. 2) or by using a full transmission gate within the data path multiplexer to allow the full rail voltage (VDD) to be driven through by that means (as shown by the multiplex & pre-charge circuit in FIG. 3). The multiplex and pre-charge circuit illustrated in FIG. 3 therefore comprises pairs of full transmission gates (both an NMOS transistor and a PMOS transistor in parallel) since they need to be able to actively drive both high and low to the memory cell arrays. In this regard, when using MOS devices as "pass transistors" NMOS devices only pull low well, whilst PMOS devices only pull high well. This is due to threshold voltages causing the channels to turn off when the signal levels are not conducive to conduction. Therefore, when it is necessary to drive both high and low signals through a switch a transmission gate comprised of both an NMOS transistor and a PMOS transistor in parallel is used.

A well-established approach for saving power is to split the memory array into a number of sections/groups (e.g. with the number of memory cells within each section usually being equal to a power of two, such as 4 or 8) in order to make the length of the bit lines in each section shorter. This is referred to as a hierarchical bit line arrangement in which, instead of a single bit line that runs the complete height of a column of memory cells and connects to each cell in the column, a multi-level structure is used. Effectively, a single bit line is broken up into multiple "local bit lines", each of which connects to a group of memory cells in a part of the column. A "global bit line" also runs the height of the column, and is connected to the local bit lines via switches. The memory read and write circuits connect to the global bit line, and not directly to the local bit line. During a memory access, only a local bit line in the relevant part of the column is connected (via an associated local-to-global switch) to the global bit line.

In such a hierarchical bit line arrangement the resulting reduction in bit line capacitance reduces power and also speeds up the reading of the memory. However, the disadvantage of this arrangement is the increased complexity of the memory unit and subsequent impact on the area consumed by the memory unit, which is frequently a prime concern for memory cell designers. Therefore, the practicality of this approach is often constrained by the economy of the interface circuitry between the local and global bit lines (e.g. in terms of area consumed etc.). In particular, the interface circuitry between the local and global bit lines must at a minimum include the bit line pre-charge means and the data path mux, and preferably some form of sense amplifier to respond to the local bit line voltage swing during a read operation and drive it onto the larger capacitive load of the global bit lines.

One aspect that impacts the implementation of a hierarchical bit line arrangement is the design of the sense amplifier that is configured to read the local bit lines. As already stated, area will naturally be a prime concern (as the circuitry will need to be replicated for each of the section/group of memory cells); however, this is contradictory to the need for providing sense amplifiers that have low input offset voltage (e.g. as variability worsens as transistor gate area is reduced); a factor which becomes increasingly problematic in deep sub-micron (DSM) technologies, where transistors with relatively large area dimensions are needed in order to avoid device variability.

In view of the above, it will be appreciated that there still exists a requirement for an improved arrangement in which the power consumption can be reduced whilst still maintaining an acceptable level of performance, and without consuming additional area.

Therefore, according to a first aspect of the present invention there is provided a memory unit. The memory unit comprises a plurality of memory cells, each memory cell of the plurality of memory cells being operatively connected to data input and output circuitry by a pair of bit lines, a pre-charge circuit configured to provide a voltage for charging the bit lines, and a multiplexer circuit. The multiplexer circuit comprises, for each bit line, an associated switch that is configured to selectively connect the bit line to the data input and output circuitry and to the pre-charge circuit when activated by a corresponding bit line selection signal. The switch consists of an NMOS device. A multiplexer controller is configured to be able to separately select each pair of bit lines by activating the associated NMOS devices using the corresponding bit line selection signals, and is configured to select all of the pairs of bit lines connected to the data input and output circuitry simultaneously when pre-charging the bit lines such that all of the bit lines connected to the data input and output circuitry are pre-charged concurrently via the NMOS devices.

Each NMOS device within the multiplexer circuit may be configured to act as a switch that is controlled by a corresponding bit line selection signal.

Each memory cell may be associated with a wordline that is configured to control the connection of the associated bit lines to the memory cell. Each pair of bit lines may be connected to a memory cell via respective access transistors that are configured to be controlled by the wordline associated with the memory cell. Each NMOS device within the multiplexer circuit may be configured such that a threshold voltage of the NMOS device is equal to or less than a threshold voltage of the respective access transistor.

The pre-charge circuit may comprises a PMOS device configured to connect a positive supply voltage (VDD) to the multiplexer circuit under control of a pre-charge control signal (PCL).

The multiplexer circuit may be configured to connect a first bit line in each pair of bit lines to a first common node of the multiplexer circuit and a second bit line in each pair of bit lines to a second common node of the multiplexer circuit. The first common node and the second common node may be provided as inputs to a sense amplifier within the data input and output circuitry. The sense amplifier may be configured to determine a data value stored in a memory cell in dependence upon the states of the bit lines associated with the memory cell.

The first common node and the second common node may be connected to a write driver within the data input and output circuitry. The write driver may be configured to drive one of the first common node and the second common node towards ground whilst holding the other of the first common node and the second common node at the pre-charge voltage.

The first common node and the second common node may be connected to the pre-charge circuit. The pre-charge circuit may be provided with a first PMOS device and a second PMOS device, the first PMOS device being configured to connect the first common node to a positive supply voltage (VDD) under control of the pre-charge control signal (PCL), and the second PMOS device being configured to connect the second common node to a positive supply voltage (VDD) under control of the pre-charge control signal (PCL).

The memory unit may further comprise, for each pair of bit lines, a bit line equilibration switch that is configured to connect a first bit line in the pair of bit lines to a second bit line (130b) in the pair of bit lines under the control of a bit line equilibration signal (BLE). Each bit line equilibration switch may comprise an NMOS device configured to act as switch controlled by the bit line equilibration signal (BLE). The memory unit may be configured to activate the bit line equilibration signal (BLE) between memory accesses.

Each memory cell may comprise a pair of cross-coupled inverters having respective first and second storage access nodes, a first access transistor operatively connected to the first storage node, a second access transistor operatively connected to the second storage node, and a word line connected to a gate on the first access transistor and a gate on the second access transistor for controlling the first access transistor and the second access transistor. A first bit line of a pair of bit lines may be operatively connected to the first storage node of the memory cell via the first access transistor, and a second bit line of a pair of bit lines is operatively connected to the second storage node of the memory cell via the second access transistor.

The plurality of memory cells may be provided in an array in which the memory cells are arranged in rows and columns, each column of the array being provided with a pair of bit lines) that are operatively connected to the memory cells in the column. The multiplexer controller may then be configured such that each of the bit line selection signals activates the NMOS devices associated with a pair of bit lines in a column of the array. Each row of the array may be provided with a wordline that is configured to control the connection of each of the memory cells in the row to the bit lines associated with the memory cell.

The memory unit may have a hierarchical bit line arrangement in which memory cells are grouped into a plurality of memory cell groups with each group of memory cells being operatively connected to local data input and output circuitry by a pair of local bit lines, the local data input and output circuitry being operatively connected to global data input and output circuitry by a pair of global bit lines.

The plurality of memory cells may form a memory cell group, and each memory cell of the memory cell group may then be operatively connected to local data input and output circuitry by a pair of local bit lines.

Each NMOS device of the multiplexer circuit can be associated with a local bit line of a memory cell group, and may then be configured to selectively connect the local bit line to the local data input and output circuitry and to the pre-charge circuit when activated by a corresponding bit line selection signal.

The multiplexer controller may be configured to be able to separately select each pair of local bit lines by activating the associated NMOS devices using the corresponding bit line selection signals, and configured to select all of the pairs of bit lines connected to the local data input and output circuitry simultaneously when pre-charging the local bit lines, such that all of the local bit lines connected to the local data input and output circuitry are pre-charged concurrently via the NMOS devices.

Alternatively, or in addition, the multiplexer controller may be configured to be able to separately select each pair of local bit lines by activating the associated NMOS devices using the corresponding bit line selection signals, and is configured to select all of the pairs of local bit lines connected to the global data input and output circuitry simultaneously when pre-charging the local bit lines, such that all of the local bit lines connected to the global data input and output circuitry are pre-charged concurrently via the NMOS devices.

The present invention will now be more particularly described by way of example only with reference to the accompanying drawings, in which:

FIG. 5a is a timing diagram illustrating an example of a read operation for a memory unit arrangement such as that illustrated FIG. 4;

FIG. 5b illustrates an example of waveforms for the bit lines and multiplex circuit common nodes corresponding to the read operation illustrated FIG. 5a;

FIG. 6b illustrates an example of waveforms for the bit lines and multiplex circuit common nodes corresponding to the write operation illustrated FIG. 6a;

Figure 1:
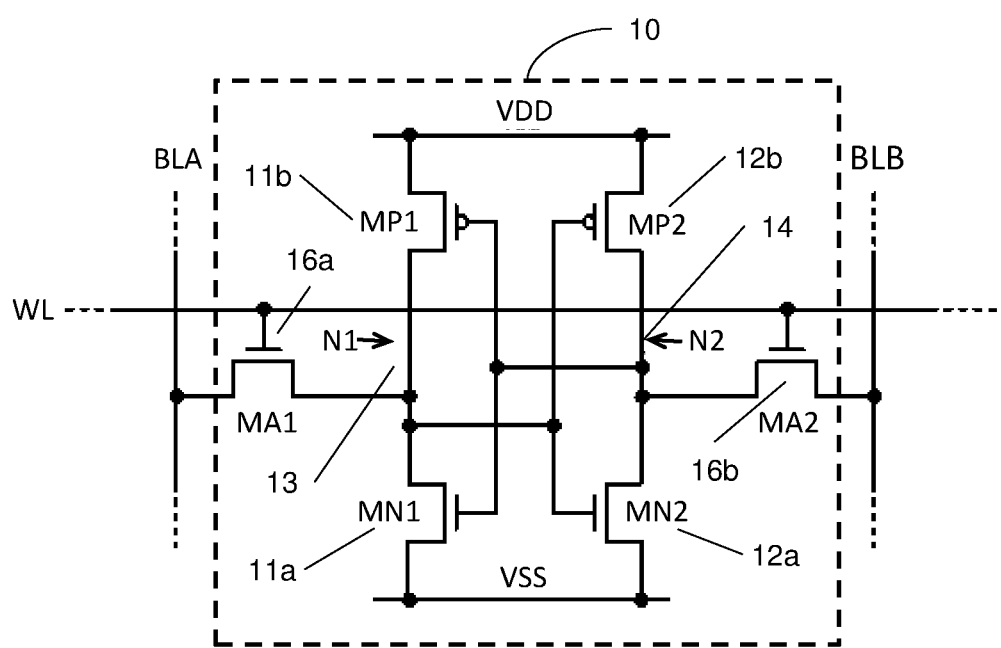
FIG. 1 illustrates a standard 6-transistor memory cell of the prior art.
Figure 2:
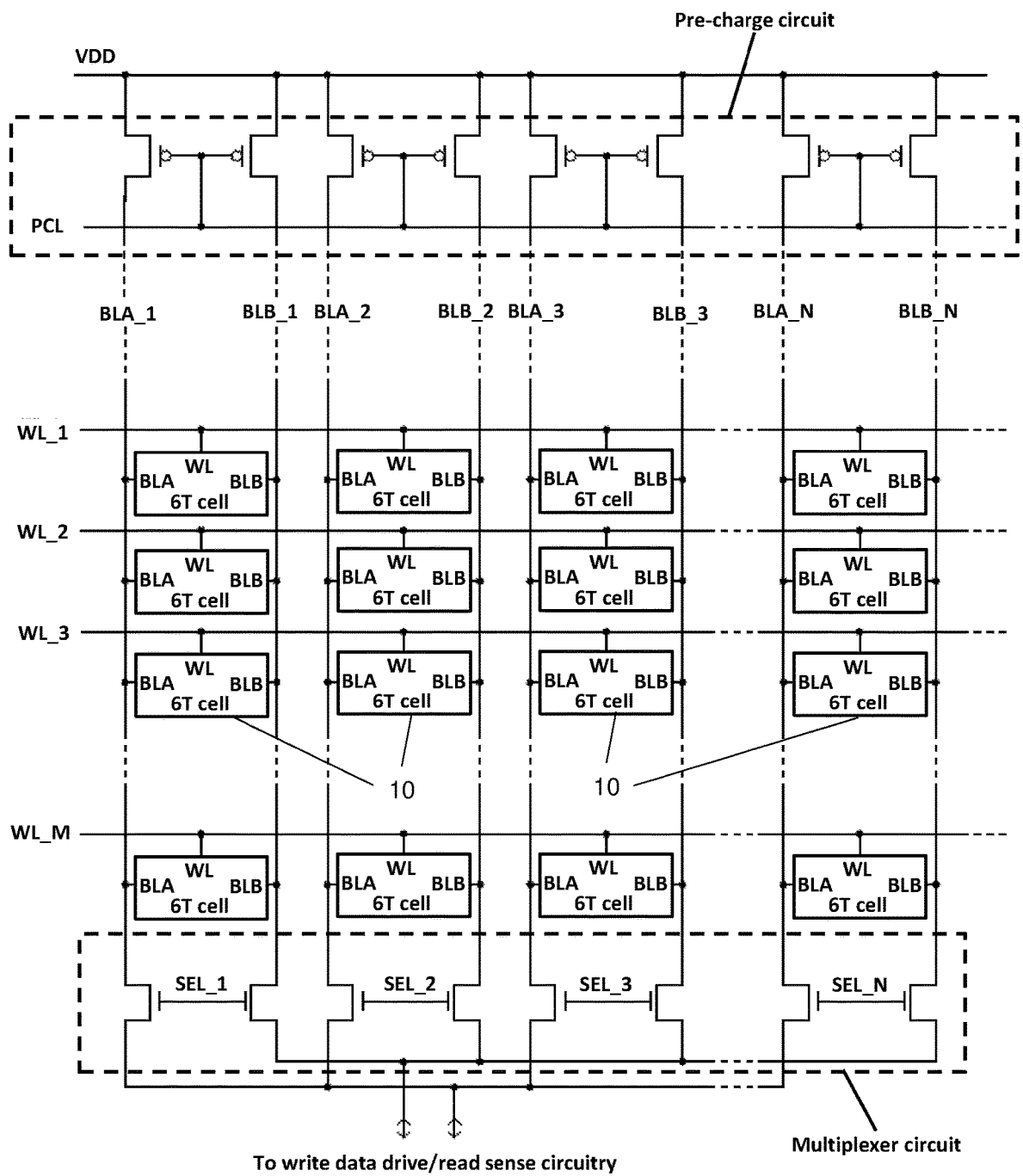
FIG. 2 illustrates a conventional block of memory constructed from traditional 6-transistor memory cells that includes separate multiplexing and pre-charge circuits.
Figure 3:
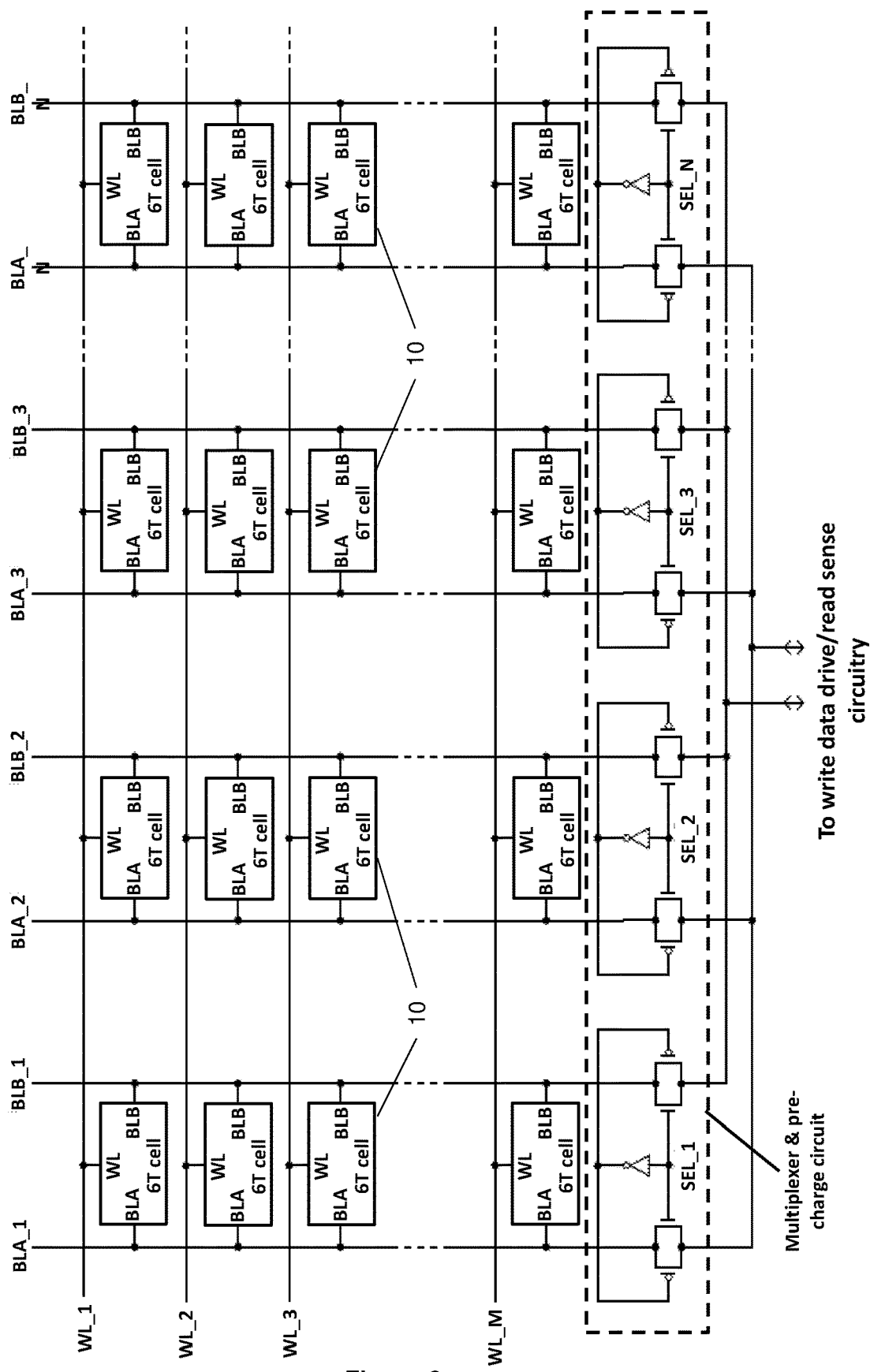
FIG. 3 illustrates a block of memory constructed from traditional 6-transistor memory cells that includes a combined multiplexing and pre-charge circuit.

As described above, the most commonly used bit line pre-charge scheme involves driving the bit line voltages up to the positive supply rail voltage (VDD), with the aim of minimizing the voltage difference between the corresponding bit line pairs. However, such schemes then require the use of a PMOS device connected to each bit line (as illustrated by the PMOS devices in the pre-charge circuit of FIG. 2 and the PMOS devices in the transmission gates of FIG. 3), which therefore leads to a significant increase in the surface area consumed by the memory unit.

Moreover, it is submitted that this is not an optimum solution either for power consumption or memory cell stability. In this regard, the word line controlled access devices (MA1 and MA2) of a memory cell are tied/connected to each of the storage nodes (N1 and N2) within the cell, with one being in a high state and the other in a low state. On the high side of the cell, when the word line is enabled, if the bit line voltage gets above approximately VDD-$V_{Tn}$ (where $V_{Tn}$ is the threshold voltage of the NMOS access device), then the NMOS access device (i.e. MA1 or MA2) is essentially turned off (as $V_{GS}$ then drops below $V_{Tn}$), so that there is no significant benefit to cell stability in raising the bit line voltage beyond that level. On the contrary, on the low side of the cell, the NMOS access device is conducting, and the internal NMOS pull-down device of the cell (i.e. NM1 or NM2) is actively trying to fight being pulled up the NMOS access device. Consequently, the higher the bit line voltage, the more it challenges the stability of the cell. From a power perspective, it is important to be able to drive the voltage on the low bit line all the way down to 0V in order to perform a write into the cell, so the lower the high bit line voltage, the lower the power consumption.

As described above, when implementing a read operation, the bit line pre-charge voltage should be high enough to avoid disruption of the high internal data storage node of a memory cell, which might otherwise be pulled low via the access devices. In this regard, as the access transistors are NMOS devices, providing that the bit line voltage is within approximately $V_{Tn}$ of the positive supply rail voltage (VDD), where $V_{Tn}$ is the threshold voltage of the NMOS device, then the access device conduction will be cut off and no significant load will be presented to that node of the memory cell. This is because, with the word line voltage ($V_{WL}$) at the positive supply rail voltage (VDD), and the bit line voltage within approximately $V_{Tn}$ of the positive supply rail voltage (VDD), the $V_{GS}$ of the access device will drop below the threshold voltage ($V_{Tn}$) of the access device.

This can be achieved solely using NMOS devices to control the bit lines, and more particularly to pre-charge the bit lines high during a read operation, since NMOS transistors can pull up to within a $V_{Tn}$ of their gate voltage (VDD in this case). The NMOS device used to control the bit lines should therefore have a $V_{Tn}$ that is similar to, or slightly lower than, that of the NMOS access devices. In particular, if the $V_{Tn}$ of the NMOS bit line control devices is slightly lower than that of the NMOS access devices, then this ensures that the pre-charge voltages of the bit lines will always be sufficiently high so as to turn off of the NMOS access devices.

According to conventional logic, this is an unattractive solution, especially for modern technologies, as the NMOS bit line control devices will only pre-charge the bit lines to approximately $V_{Tn}$ below VDD, and because the threshold voltage of each NMOS device will be subject to inevitable variability effects, such that the bit line pre-charge voltages will show similar variation. Whilst this is indeed the case, it is recognized herein that this does not necessarily result in a degradation of a data sensing operation, provided that the exact same NMOS devices that are used to pre-charge the bit lines are also used as a common gate/cascode input stage to the sense amplifier that is being used to implement the read/data sense operation. In particular, it is recognized herein that by using the same NMOS devices that are used to pre-charge the bit lines as an input stage to the sense amplifier allows the $V_{Tn}$ variation effects to cancel out and is also easy to implement.

Figure 4:
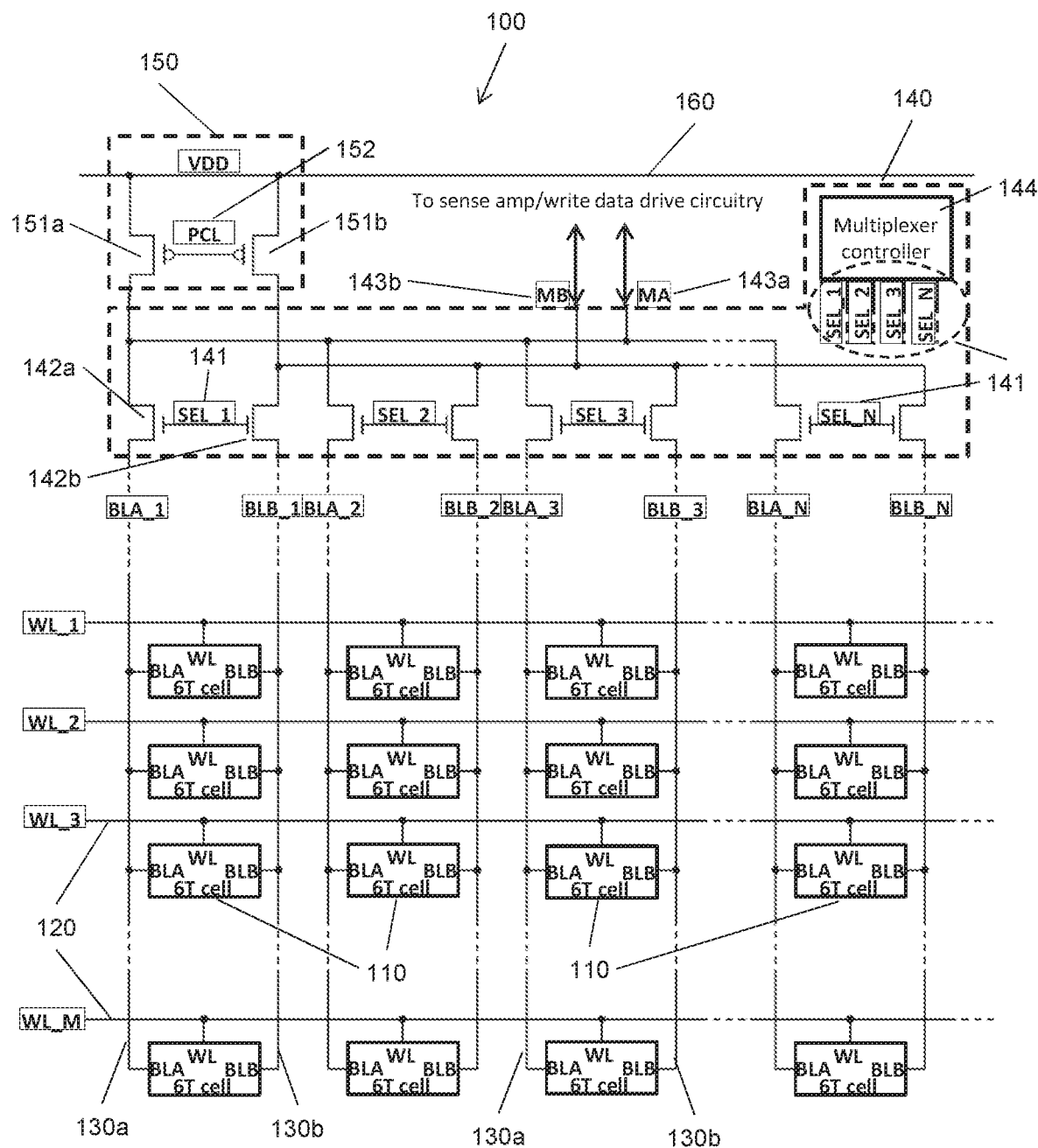
FIG. 4 illustrates an embodiment of an improved memory unit as described herein.

FIG. 4 illustrates an embodiment of a memory unit 100 that incorporates NMOS-only control of the bit lines. The memory unit 100 comprises an array of 6-transistor memory cells 110 with word lines 120 extending along each row of the array, each word line 120 being operatively connected to a number of the memory cells 110 in the row, and bit lines 130a, 130b extending along each column of the array, each bit line 130a, 130b being operatively connected to a number of memory cells 110 in the column. The memory unit 100 also comprises an NMOS-only multiplexer circuit 140 that controls access to the bit lines 130a, 130b.

The multiplexer circuit 140 is configured to connect each pair of bit lines 130a, 130b to the data input/output circuitry (i.e. write driver and sense amplifier) (not shown). To do so, the multiplexer circuit 140 is configured to select which of the bit lines within the array is to be accessed (for either a read or write) using a set of bit line selection signals (SEL_1, SEL_2 etc.) 141 which are derived from the address supplied to the memory. The NMOS-only multiplexer circuit 140 therefore comprises, for each bit line 130a, 130b, an NMOS bit line control device 142a, 142b that is configured to act as switch that connects the bit line 130a, 130b to data input/output circuitry under the control of a corresponding bit line selection signal 141. In particular, the complementary bit lines 130a, 130b of a bit line pair (that extends along a column of the array) are each connected to respective NMOS bit line control devices 142a, 142b that are controlled by the same bit line selection signal 141 (e.g. the NMOS bit line control devices that are connected to BLA_1 and BLB_1 are both controlled by SEL_1 and so on).

In the example illustrated in FIG. 4, the NMOS bit line control devices 142a in the multiplexer circuit that are connected to the first bit line (BLA) 130a in each pair are configured to connect the first bit line (BLA) in each pair to a first common node (MA) 143a of the multiplexer circuit, whilst the NMOS bit line control devices 142b in the multiplexer circuit that are connected to the second bit line (BLB) 130b in each pair are configured to connect the second bit line (BLB) in each pair to a second common node (MB) 143b of the multiplexer circuit 140.

The multiplexer circuit 140 also comprises a multiplexer controller 144 that provides the bit line selection signals 141 that control the NMOS bit line control devices 142a, 142b of the multiplexer circuit, and it is the multiplexer controller 144 that implements the activation of the NMOS bit line control devices 142a, 142b in accordance with the address supplied to the memory.

In addition, the multiplexer controller 144 is configured to be able to select all of the bit lines in the memory unit simultaneously (i.e. by turning on all of the NMOS bit line control devices) when pre-charging the bit lines 130a, 130b, so that all of the bit lines can be pre-charged concurrently via the NMOS bit line control devices 142a, 142b. The multiplexer circuit 140 therefore also connects the bit lines to a pre-charge circuit 150 that is configured to provide the positive supply voltage (VDD) for charging the bit lines.

In the example illustrated in FIG. 4, the pre-charge circuit 150 comprises two PMOS devices 151a, 151b that are respectively configured to connect the first common node (MA) 143a and the second common node (MB) 143b of the multiplexer circuit 144 to the positive rail (VDD) 160 under the control of a pre-charge control signal (i.e. PCL) 152. The PMOS devices 151a, 151b can therefore be used to pre-charge and clamp/hold the common nodes 143a, 143b of the multiplexer circuit 140 (i.e. MA and MB) to VDD when the bit lines are pre-charged (i.e. via the NMOS bit line control devices by enabling all of the bit line selection signals, SEL_1, SEL_2 etc.).

FIG. 5a is a timing diagram illustrating an example of a read operation for a memory unit arrangement such as that described above in relation to FIG. 4, and FIG. 5b illustrates an example of the corresponding waveforms for the bit lines and multiplex circuit common nodes (i.e. MA and MB) for the read operation.

To implement the read operation the multiplexer controller 144 selects all of the bit lines simultaneously (i.e. by using the bit line selection signals 141 to turn on all of the NMOS bit line control devices 142a, 142b) and the pre-charge control signal (PCL) 152 turns on the PMOS devices 151a, 151b (i.e. PCL goes low), such that the multiplexer circuit 140 and the bit lines of all columns are connected to the positive rail. As a result, the multiplexer circuit common nodes (i.e. MA and MB) 143a, 143b are pre-charged to VDD, whilst the bit lines 130a, 130b are pre-charged via the NMOS bit line control devices 142a, 142b to approximately $V_{Tn}$ below VDD (i.e. approximately VDD-$V_{Tn}$), although there will be some degree of variation in the pre-charge potential of each of the bit lines that reflects the variability of the NMOS devices 142a, 142b in the multiplex circuit 140. Therefore, in FIG. 5b, the gap between waveforms for the bit lines and multiplex circuit common nodes after the initial pre-charging is approximately equal to the $V_{Tn}$ of the NMOS bit line control devices 142a, 142b.

When the pre-charge is complete, the bit line selection signals 141 for all but the target memory column are driven low, such that only the column of interest is selected by the multiplexer circuit 140. In this example, the memory cell 110 to be read is in the first column of the memory unit 100, such that the bit line selection signal for the bit lines in the first column (i.e. SEL_1) is kept high and the connection of the bit lines in the first column to the data input/output circuitry is maintained, whilst the bit line selection signal for the other bit lines in the other columns (i.e. SEL_2, SEL_3, etc.) are driven low such that these other bit lines are disconnected from the data input/output circuitry.

The PMOS devices 151a, 151b connecting the multiplexer circuit 140 to the positive voltage supply rail 160 are then turned off (i.e. the pre-charge control signal (PCL) goes high), and the wordline for the required row (given in this example as WL_x) is enabled such that the memory cell to be read is then connected to the associated bit lines (i.e. by turning on the access devices within the memory cell). The connection of the memory cell to be read to the associated bit lines allows the memory cell to pull down one of the two bit lines depending upon its stored state (i.e. the data value stored in the cell). In the example illustrated in FIG. 5b, bit line BLA_1 is pulled low by the low voltage side of the memory cell, whilst BLB_1 remains at its pre-charge voltage.

With the PMOS devices 151a, 151b turned off, and a voltage close to the threshold voltage ($V_{Tn}$) established between the gate (which is held at VDD as provided by SEL_1) and the source (which is at the level of the attached bit line) of the selected NMOS bit line control devices 142a, 142b in the multiplexer circuit 140 (i.e. the NMOS bit line control devices connected to the column being read), a small drop in bit line voltage will be sufficient to turn on the NMOS bit line control device (as the drop in the voltage of the source node will lead to an increase of $V_{GS}$ to above $V_{Tn}$). Consequently, for the bit line that is being pulled low, this will cause the associated common node 143a, 143b (either MA or MB) of the multiplexer circuit 140, which will have a lower capacitance than the bit line, to rapidly drop towards the bit line voltage. This is illustrated in FIG. 5b by the rapid convergence of the voltages on the bit line, BLA_1, and the corresponding common node, MA, of multiplex circuit.

The NMOS bit line control device is therefore acting as a common gate/cascode amplifier during the sense operation. In this regard, when operating in a common gate configuration, the gate of the NMOS device is common (i.e. is held static), whilst the input is provided at the source node and the output is provided at the drain node. The NMOS bit line control devices in the multiplexer circuit therefore effectively acts as a gain stage converting the relatively small change on the bit line into a larger swing on the inputs to the sense amplifier, thereby reducing the voltage offset demands on the sense amplifier itself, and obviating the need to make use of extra area to address sense amplifier variability.

Figure 6A:
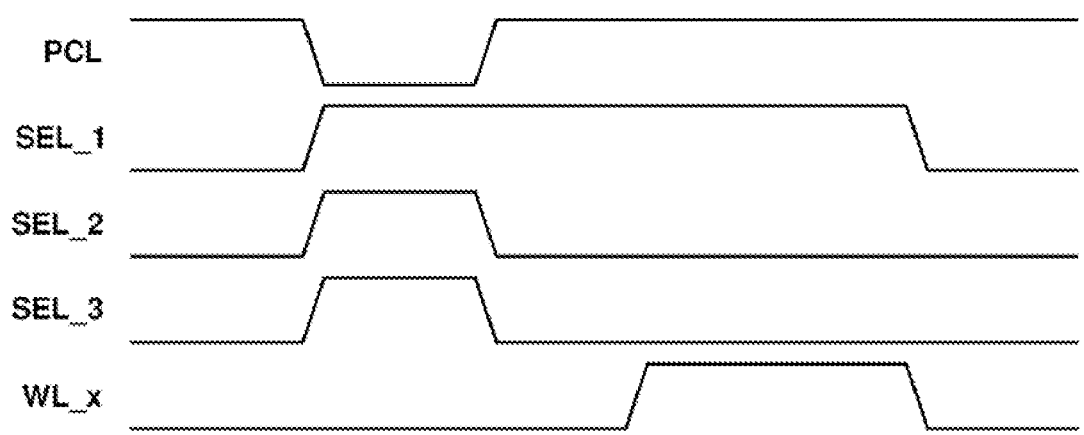
FIG. 6a is a timing diagram illustrating an example of a write operation for a memory unit arrangement such as that illustrated FIG. 4.
Figure 6B:
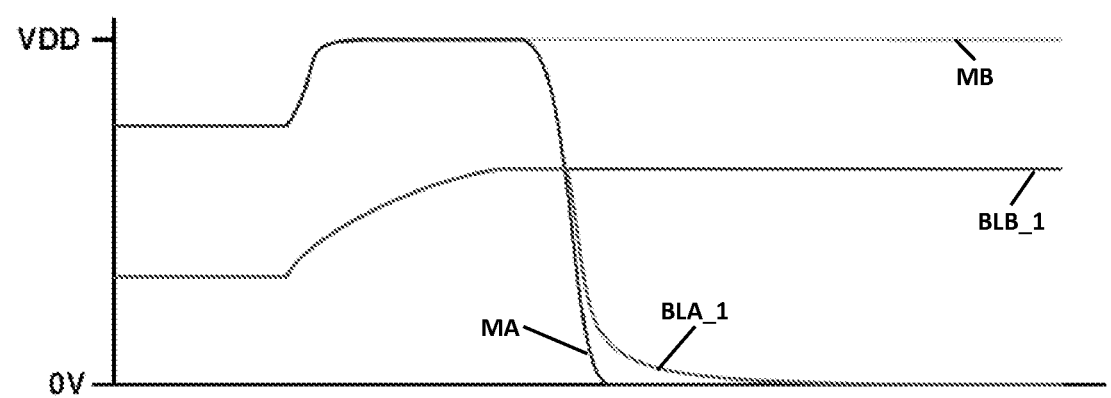

FIG. 6a is a timing diagram illustrating an example of a write operation for a memory unit arrangement such as that described above in relation to FIG. 4, and FIG. 6b illustrates an example of the corresponding waveforms for the bit lines and multiplex circuit common nodes (i.e. MA and MB) for the read operation.

To implement a write operation, the process is initially similar to the read operation, requiring an initial pre-charge cycle in which the multiplexer controller 144 selects all of the columns simultaneously (i.e. by using the bit line selection signals 141 to turn on all of the NMOS devices 142a, 142b) and the pre-charge control signal (PCL) 152 turns on the PMOS devices 151a, 151b (i.e. PCL goes low), such the multiplexer circuit 140 and the bit lines 130a, 130b in all columns are connected to the positive rail 160. As a result, the multiplexer circuit common nodes 143a, 143b (i.e. MA and MB) are pre-charged to VDD, whilst the bit lines 130a, 130b are pre-charged via the NMOS devices 142a, 142b to approximately $V_{Tn}$ below VDD (i.e. approximately VDD-VTn).

When the pre-charge is complete, the bit line selection signals 141 for all but the target memory column are driven low, such that only the bit lines in the column of interest are selected by the multiplexer circuit 140. In this example, the memory cell to be written to is in the first column of the memory unit 100, such that the bit line selection signal for the bit lines in the first column (i.e. SEL_1) is kept high and the connection of the bit lines of the first column to data input/output circuitry is maintained, whilst the bit line selection signals of the other bit lines in the other columns (i.e. SEL_2, SEL_3, etc.) are driven low such that the bit lines of these columns are disconnected from the data input/output circuitry.

The PMOS devices 151a, 151b connecting the multiplexer circuit 140 to the positive voltage supply rail 160 are then turned off (i.e. the pre-charge control signal (PCL) 152 goes high). Then, in contrast with the read operation, the write operation proceeds by driving the multiplexer circuit common nodes 143a, 143b (i.e. MA and MB) to the required complementary states (i.e. one high and the other low). In the example illustrated in FIG. 6b, common node MA is driven low whilst the other common node MB remains at its pre-charge voltage. This drives one of the bit lines in the selected column towards ground whilst holding the other bit line in the selected column roughly at its pre-charge voltage. By enabling the word line for the required row (given in this example as WL_x) the memory cell to be written to is then connected to the associated bit lines (i.e. by turning on the access devices within the memory cell), causing the data to be written into the target memory cell. The word line (WL_x) is then driven low to disconnect the memory cell from the associated bit lines with the data stored in the cell.

One possible issue that arises when using NMOS-only bit line control is that if the bit line voltage drifts too high (e.g. due to some form of capacitive charge injection), then the pre-charge mechanism alone will not be able to pull the bit line voltage down into the correct operating range. It is proposed herein that in order to solve this problem the bit line pairs 130a, 130b can be equilibrated between memory accesses (i.e. between read and/or write operations). In this regard, as any access to a memory cell will inevitably result in one or other of a pair of complementary bit lines being pulled low (i.e. either by a memory cell during a read operation, or by the data input circuitry during a write operation), the inclusion of an additional switch between the bit lines of a bit line pair provides a means by which the bit lines can be connected together after each memory access. In particular, by turning on the additional switch and thereby connecting the two bit lines together, the two bit lines will converge to the same voltage somewhere below the pre-charge voltage level, thereby eliminating the high drift problem. Furthermore, since this process is simply a redistribution of charge stored on the bit lines (rather than being drawn from the power supply) this consumes no extra power other than the relatively small cost of turning on the equilibration switches.

Figure 7:
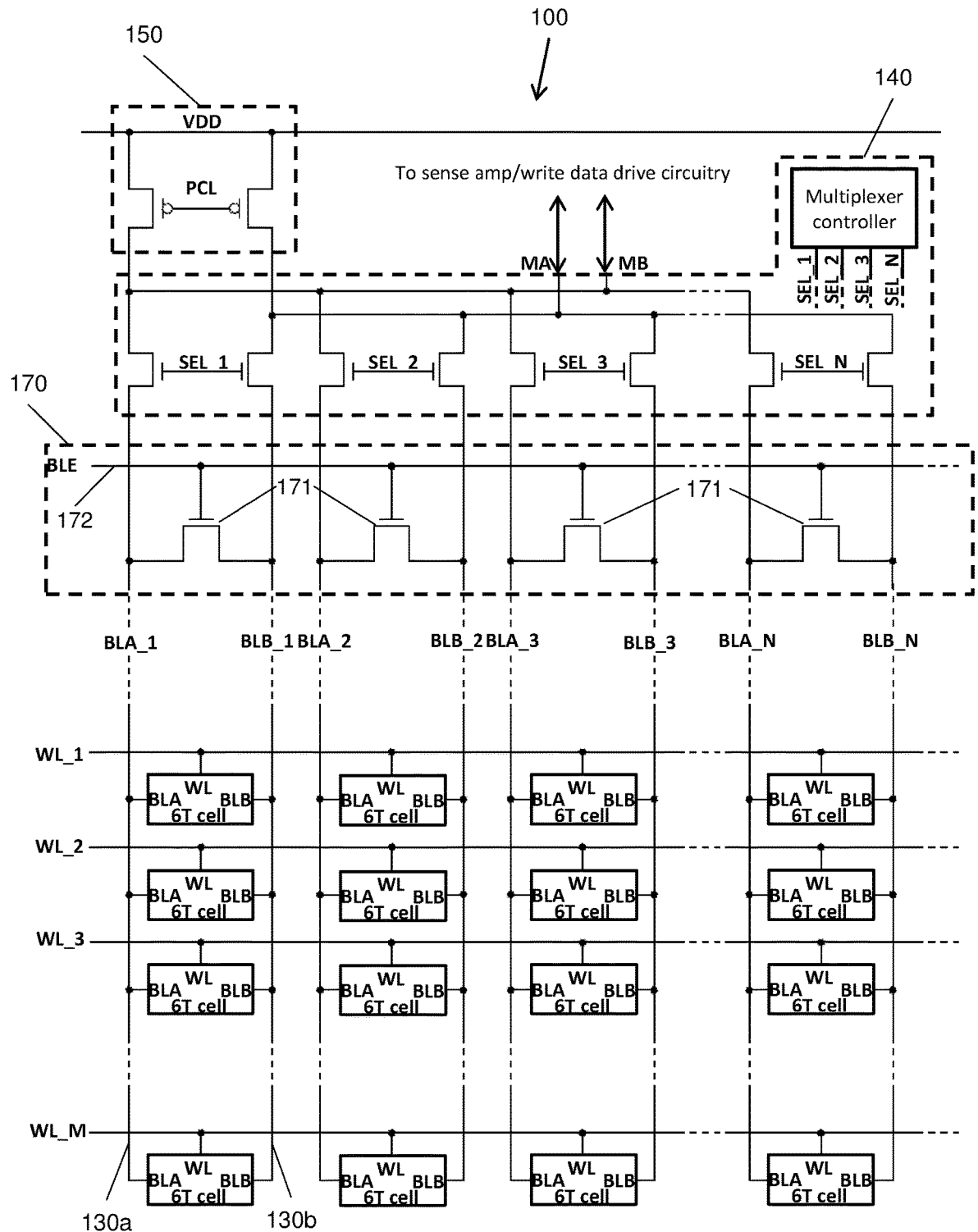
FIG. 7 illustrates an alternative embodiment an improved memory unit as described herein.

FIG. 7 therefore illustrates an embodiment of the memory unit 100 of FIG. 4, and also including a bit line equilibration circuit 170. The bit line equilibration circuit 170 comprises, for each column, a bit line equilibration switch 171 that is configured to connect together the bit lines 130a, 130b in the pair of complementary bit lines when the switch 171 is activated. In this example, each column of the memory unit 100 includes an NMOS device as a bit line equilibration switch 171 that is configured to connect together the bit lines 130a, 130b in a pair of complementary bit lines under the control of a bit line equilibration signal (BLE) 172. The memory unit will therefore be configured to activate the bit line equilibration signal (BLE) 172 between memory accesses.

In addition, as detailed above, the main factor determining the practicality of implementing a hierarchical memory architecture is economy of the local-to-global bit line interface circuitry. Therefore, the use of the NMOS-only control of the bit lines described herein (i.e. to provide a combined mux/pre-charge circuit), with its gain benefit, is also beneficial for hierarchical bit line arrangements, as it allows for a relatively economical design of sense amplifier to be used. In particular, rather than trying to eliminate any pre-charge voltage difference between the local bit lines, and then using a low offset voltage sense amplifier to read the data on local bit lines (as per the conventional approach, which would have a large area overhead), the NMOS-only control of the bit lines described herein pre-charges each local bit line to a level which reflects the threshold voltage of the associated NMOS bit line control device, but then effectively uses that exact same NMOS device when sensing the voltage swing on the local bit line, thereby compensating for the intrinsic threshold voltage variations. This NMOS-only control of the local bit lines is therefore attractive for application in a hierarchical bit line situation, where economy of area is a pressing concern.

Figure 8:
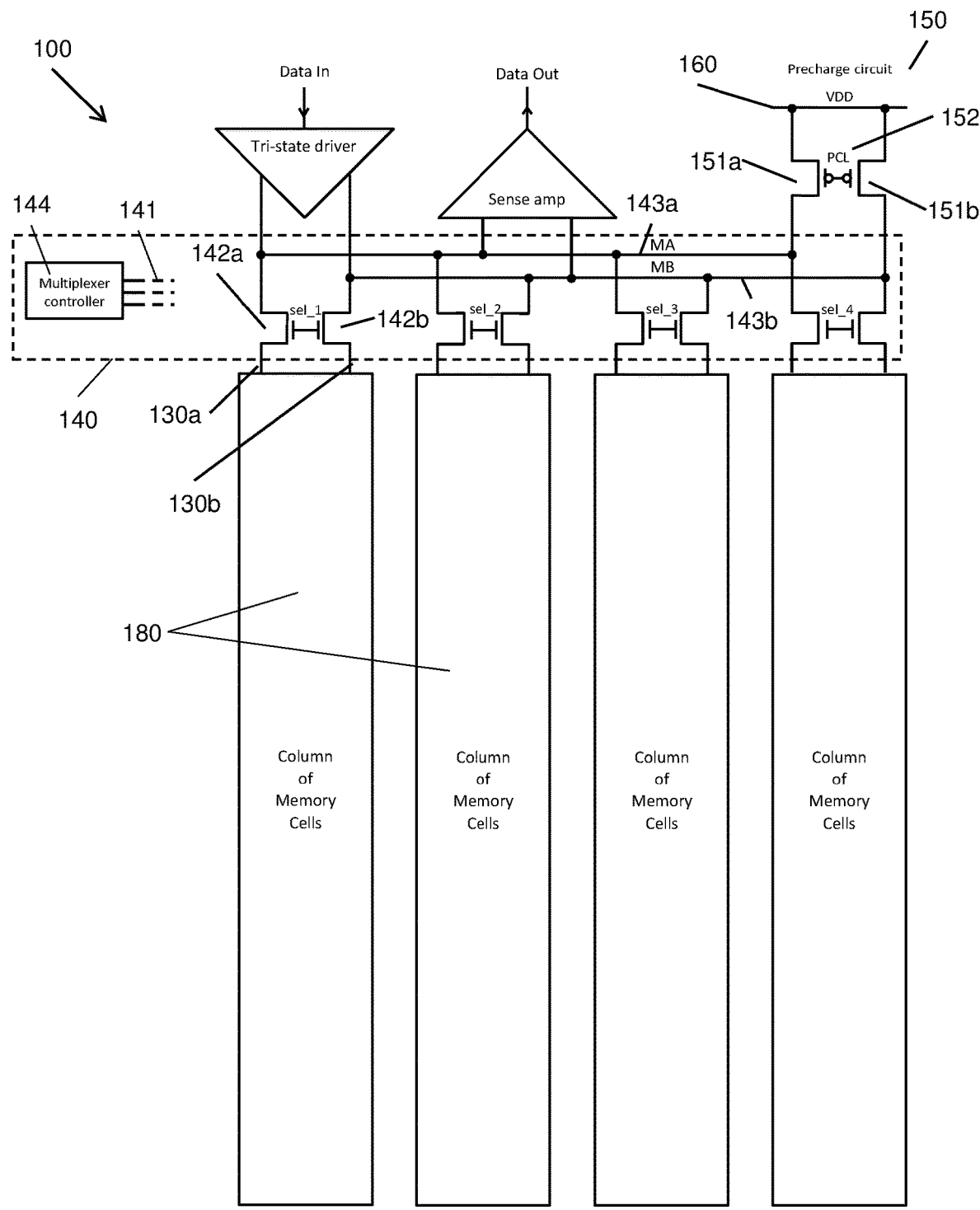
FIG. 8 illustrates schematically an improved non-hierarchical memory architecture as described herein.
Figure 9:
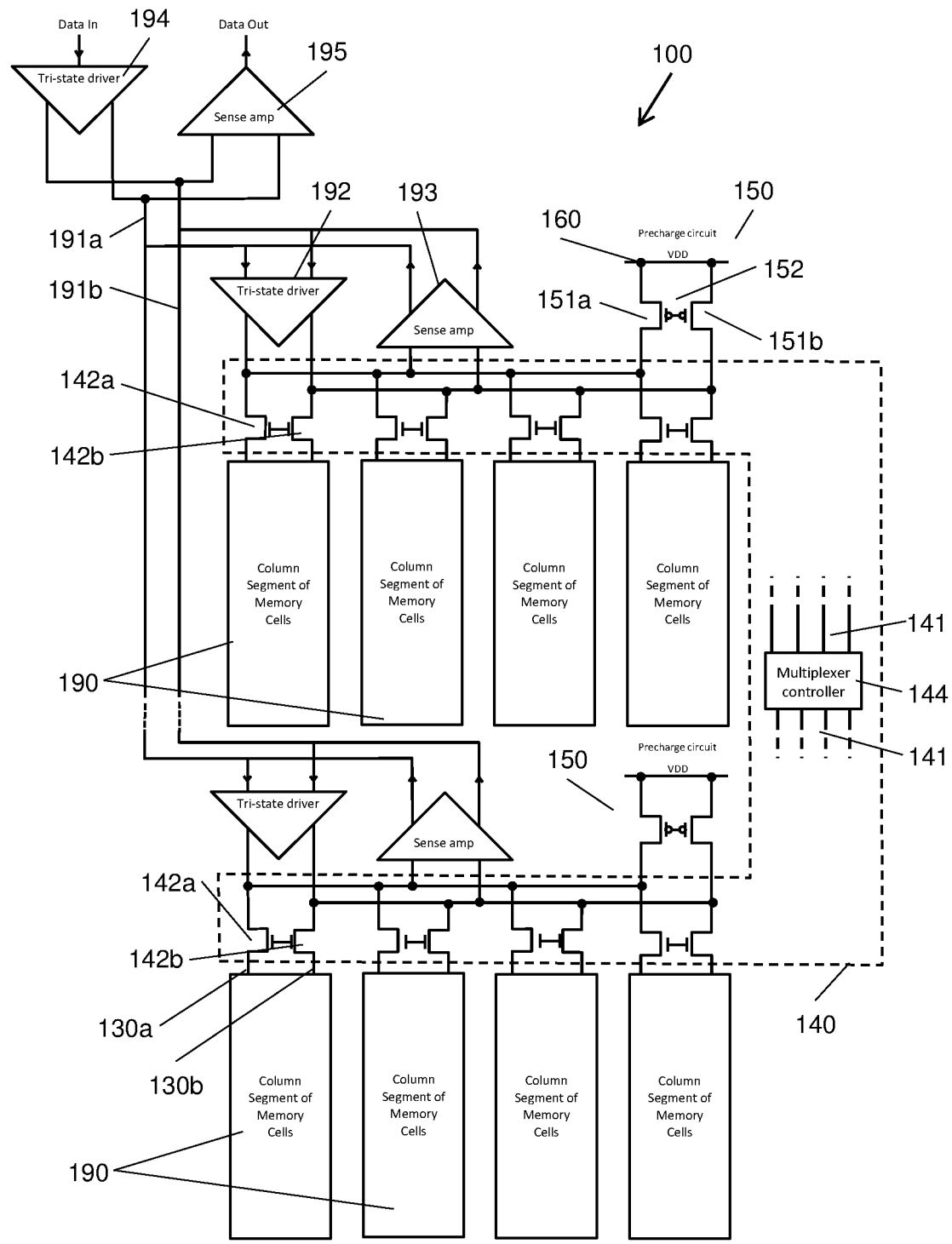
FIG. 9 illustrates schematically an improved hierarchical memory architecture as described herein.

To illustrate the application of NMOS-only control of the local bit lines in hierarchical memory architecture, FIG. 8 illustrates schematically the non-hierarchical memory unit 100 of FIG. 4 whilst FIG. 9 illustrates schematically an embodiment of memory unit 100 that has a hierarchical architecture. In FIG. 8, the memory cells of the non-hierarchical memory unit 100 are arranged in columns, and each column has a single pair of complementary bit lines 130a, 130b that runs the complete height of the column and connects to each cell in the column. In contrast, in the hierarchical memory architecture illustrated in FIG. 9, the bit lines in each column are effectively broken up into multiple local bit lines 130a, 130b, with each of the local bit lines 130a, 130b connecting to a group/block of memory cells in a separate segment/part of the column 190. Global bit lines 191a, 191b then run the height of a column, and are connected to the local bit lines via some local-to-global bit line interface circuitry. Global memory read and write circuitry then connects to the global bit lines 191a, 191b, and not directly to the local bit lines 130a, 130b.

In the hierarchical memory architecture illustrated in FIG. 9, the local-to-global bit line interface circuitry includes a local bit line pre-charge circuit 150, a local write driver 192, and a local sense amplifier 193 that is configured to respond to the local bit line voltage swing during a read operation and drive it onto the larger capacitive load of the global bit lines. The local-to-global bit line interface circuitry also includes an NMOS-only multiplexer circuit 140 that controls access to the local bit lines 130a, 130b. In the same manner as described above in relation to the non-hierarchical memory architecture, the multiplexer circuit 140 is configured to control the connection of each pair of local bit lines 130a, 130b to the local data input/output circuitry (i.e. local write driver 192 and local sense amplifier 193) by using the bit line selection signals 141 to activate the NMOS bit line control devices 142a, 142b that connect the local bit lines 130a, 130b to the local data input/output circuitry.

As described above, the NMOS-only multiplexer circuit 140 comprises a multiplexer controller 144 that provides the bit line selection signals 141 that control the NMOS bit line control devices 142a, 142b connected to the local bit lines 130a, 130b, and it is the multiplexer controller 144 that implements the activation of the NMOS bit line control devices 142a, 142b in accordance with the address supplied to the memory. In addition, the multiplexer controller 144 is configured to be able to select all of the local bit lines in the memory unit simultaneously (i.e. by turning on all of the NMOS bit line control devices) when pre-charging the local bit lines 130a, 130b, so that all of the local bit lines can be pre-charged concurrently via the NMOS bit line control devices 142a, 142b. The multiplexer circuit 140 therefore also connects the local bit lines to a pre-charge circuit 150 that is configured to provide the positive supply voltage (VDD) for charging the bit lines.

Alternatively, the multiplexer controller 144 can be configured to be able to select all of the local bit lines in a particular group/block of memory cells simultaneously (i.e. by turning on all of the NMOS bit line control devices associated with the corresponding local data input and output circuitry) when pre-charging the local bit lines 130a, 130b, so that all of the local bit lines in the group/block are pre-charged concurrently via the NMOS bit line control devices 142a, 142b. The multiplexer circuit 140 therefore connects the local bit lines of a group/block of memory cells to a local pre-charge circuit 150 that is configured to provide the positive supply voltage (VDD) for charging the local bit lines.

In a hierarchical memory architecture such as that illustrated in FIG. 9, pre-charging all of the local bit lines in the memory simultaneously theoretically offers faster operation (as the pre-charge can take place before the target address is known), whereas only pre-charging the local bit lines in a target group/block of memory is more power efficient. In this regard, the multiplexer controller 144 can be configured to provide both modes of operation, with each mode being selectable using an input pin.

It will be appreciated that individual items described above may be used on their own or in combination with other items shown in the drawings or described in the description and that items mentioned in the same passage as each other or the same drawing as each other need not be used in combination with each other. In addition, the expression "means" may be replaced by actuator or system or device as may be desirable. In addition, any reference to "comprising" or "consisting" is not intended to be limiting in any way whatsoever and the reader should interpret the description and claims accordingly. Furthermore, although the invention has been described in terms of preferred embodiments as set forth above, it should be understood that these embodiments are illustrative only.

Those skilled in the art will be able to make modifications and alternatives in view of the disclosure which are contemplated as falling within the scope of the appended claims. For example, those skilled in the art will appreciate that the above-described invention might be equally applicable to other types of memory. In addition, whilst the hierarchical memory architecture FIG. 9 is illustrated as having a single multiplex controller controlling multiplexing for all of the local bit lines in the memory, it is equally possible to provide individual multiplex controllers for each group/block of memory. In this regard, individual multiplex controllers can be used as separate signals are required for controlling the NMOS bit line control devices of the different memory blocks, and these will be derived logically from a combination of top-level control signals and the input address (which will identify the target block).

The invention claimed is:

1. A SRAM memory unit comprising:
a plurality of memory cells, each memory cell of the plurality of memory cells being operatively connected to data input and output circuitry by a pair of bit lines;
pre-charge circuitry, comprising a pre-charge circuit configured to provide a voltage for pre-charging the bit lines;
a multiplexer circuit consisting of:
for each bit line, a same associated first switch that is configured to selectively connect the bit line to the data input and output circuitry, and to the pre-charge circuit when activated by a corresponding bit line selection signal, the associated first switch consisting of an NMOS device, and
a multiplexer controller that is configured to be able to separately select each pair of bit lines by activating the associated first switch NMOS devices using the corresponding bit line selection signals, and that is configured to select all of the pairs of bit lines connected to the data input and output circuitry simultaneously when pre-charging the bit lines such that all of the bit lines connected to the data input and output circuitry are pre-charged concurrently via the first switch NMOS devices by the pre-charge circuit that is configured to connect a positive supply voltage, VDD, to the multiplexer circuit under control of a pre-charge control signal, PCL; and
for each pair of bit lines, a single bit line equilibration circuit, comprising a second bit line equilibration switch that is configured to connect a first bit line in the pair of bit lines to a second bit line in the pair of bit lines under the control of a bit line equilibration signal, BLE, wherein the second bit line equilibration switch is an NMOS device, wherein the second bit line equilibration switch is configured to connect the first bit line to the second bit line when activated by the bit line equilibration signal, BLE, between memory accesses, wherein the PCL and BLE signals are supplied to the pre-charge circuit and the second bit line equilibration switch, respectively, on different signal lines, and wherein all pre-charge circuitry configured to connect VDD to the multiplexer circuit under control of the PCL signal is arranged on the side of the associated first switches opposite to that of the respective bit line equilibration circuits.

2. The SRAM memory unit of claim 1, wherein each NMOS device within the multiplexer circuit is configured to act as a switch that is controlled by the corresponding bit line selection signal.

3. The SRAM memory unit of claim 2, wherein each memory cell is associated with a wordline that is configured to control the connection of the associated bit lines to the memory cell.

4. The SRAM memory unit of claim 3, wherein each pair of bit lines is connected to the memory cell via respective access transistors that are configured to be controlled by the wordline associated with the memory cell.

5. The SRAM memory unit of claim 4, wherein each NMOS device within the multiplexer circuit is configured such that a threshold voltage of the NMOS device is equal to or less than a threshold voltage of the respective access transistor.

6. The SRAM memory unit of claim 5, wherein the pre-charge circuit comprises a PMOS device.

7. The SRAM memory unit of claim 1, wherein the multiplexer circuit is configured to connect a first bit line in each pair of bit lines to a first common node of the multiplexer circuit and a second bit line in each pair of bit lines to a second common node of the multiplexer circuit.

8. The SRAM memory unit of claim 7, wherein the first common node and the second common node are provided as inputs to a sense amplifier within the data input and output circuitry, and wherein the sense amplifier is configured to determine a data value stored in the memory cell in dependence upon the states of the bit lines associated with the memory cell.

9. The SRAM memory unit of claim 7, wherein the first common node and the second common node are connected to a write driver within the data input and output circuitry, and wherein the write driver is configured to drive one of the first common node and the second common node towards ground whilst holding the other of the first common node and the second common node at a pre-charge voltage.

10. The SRAM memory unit of claim 9, wherein the first common node and the second common node are connected to the pre-charge circuit, and wherein the pre-charge circuit is provided with a first PMOS device and a second PMOS device, the first PMOS device being configured to connect the first common node to the positive supply voltage, VDD, under control of the pre-charge control signal, PCL, and the second PMOS device being configured to connect the second common node to the positive supply voltage, VDD, under control of the pre-charge control signal, PCL.

11. The SRAM memory unit of claim 1, wherein each memory cell comprises a pair of cross-coupled inverters having respective first and second storage access nodes, a first access transistor operatively connected to the first storage node, a second access transistor operatively connected to the second storage node, and a word line connected to a gate on the first access transistor and a gate on the second access transistor for controlling the first access transistor and the second access transistor.

12. The SRAM memory unit of claim 1, wherein a first bit line of the pair of bit lines is operatively connected to a first storage node of the memory cell via a first access transistor, and a second bit line of the pair of bit lines is operatively connected to a second storage node of the memory cell via a second access transistor.

13. The SRAM memory unit of claim 1, wherein the plurality of memory cells are provided in an array in which the memory cells are arranged in rows and columns, each column of the array being provided with the pair of bit lines that are operatively connected to the memory cells in the column.

14. The SRAM memory unit of claim 13, wherein the multiplexer controller is configured such that each of the bit line selection signals activates the NMOS devices associated with the pair of bit lines in a column of the array.

15. The SRAM memory unit of claim 14, wherein each row of the array is provided with a wordline that is configured to control the connection of each of the memory cells in the row to the bit lines associated with the memory cell.

16. The SRAM memory unit of claim 1, wherein the memory unit has a hierarchical bit line arrangement in which the memory cells are grouped into a plurality of memory cell groups with each group of memory cells being operatively connected to local data input and output circuitry by a pair of local bit lines, the local data input and output circuitry being operatively connected to global data input and output circuitry by a pair of global bit lines.

17. The SRAM memory unit of claim 16, wherein the plurality of memory cells groups form the memory cell group, and each memory cell of the memory cell group is operatively connected to the local data input and output circuitry by the pair of local bit lines.

18. The SRAM memory unit of claim 17, wherein each NMOS device of the multiplexer circuit is associated with the local bit line of the memory cell group, and is configured to selectively connect the local bit line to the local data input and output circuitry and to the pre-charge circuit when activated by the corresponding bit line selection signal.

19. The SRAM memory unit of claim 18, wherein the multiplexer controller is configured to be able to separately select each pair of local bit lines by activating the associated NMOS devices using the corresponding bit line selection signals, and is configured to select all of the pairs of bit lines connected to the local or global data input and output circuitry simultaneously when pre-charging the local bit lines, such that all of the local bit lines connected to the local data input and output circuitry are pre-charged concurrently via the NMOS devices.

* * * * *